(12) United States Patent
Yadav et al.

(10) Patent No.: US 12,234,342 B2
(45) Date of Patent: Feb. 25, 2025

(54) CARBON NANO MATERIALS IN CROSSLINKED POLYURETHANE AND POLYUREA APPLICATIONS WITH OPTIMIZED PROPERTIES

(71) Applicant: Chromaflo Technologies Corporation, Ashtabula, OH (US)

(72) Inventors: Santosh K. Yadav, Geneva, OH (US); Paul A. Rettinger, Ashtabula, OH (US)

(73) Assignee: Chromaflo Technologies Corporation, Ashtabula, OH (US)

( * ) Notice: Subject to any disclaimer, the term of this patent is extended or adjusted under 35 U.S.C. 154(b) by 241 days.

(21) Appl. No.: 17/937,589

(22) Filed: Oct. 3, 2022

(65) Prior Publication Data

US 2023/0112515 A1  Apr. 13, 2023

Related U.S. Application Data

(60) Provisional application No. 63/251,149, filed on Oct. 1, 2021.

(51) Int. Cl.
*C08K 3/04* (2006.01)
*C08J 3/22* (2006.01)
*H01B 1/24* (2006.01)
*H05K 9/00* (2006.01)

(52) U.S. Cl.
CPC .............. *C08K 3/041* (2017.05); *C08J 3/226* (2013.01); *H01B 1/24* (2013.01); *H05K 9/0079* (2013.01); *C08J 2375/02* (2013.01); *C08J 2375/04* (2013.01); *C08K 2201/001* (2013.01); *C08K 2201/011* (2013.01)

(58) Field of Classification Search
CPC ....... C08K 3/041; C08J 3/226; C08J 2375/02; C08J 2375/04; C08L 75/04
See application file for complete search history.

(56) References Cited

FOREIGN PATENT DOCUMENTS

JP   2003308734 A * 10/2003 ............ C08G 85/00
WO  WO 2012066244 A1 * 5/2012 ............ C08J 3/223

* cited by examiner

*Primary Examiner* — Khanh T Nguyen
(74) *Attorney, Agent, or Firm* — BENESCH, FRIEDLANDER, COPLAN & ARONOFF LLP

(57) ABSTRACT

Disclosed herein are novel methods to handling carbon nano materials and forming composite materials from carbon nano materials and polymers such as polyurethane and polyurea materials. Such novel methods provide a number of benefits to a polymer processor and end user of any resulting materials or products. As disclosed herein, methods of incorporating carbon nano materials into polymers can achieve benefits regarding electrical properties, modulus, and thermal stability as well as other benefits. However, enhancing and creating such improvements in material properties must be done with care because creating or enhancing one property does not always result in the creation or improvement in other properties. For example, thermal stability, electrical conductivity, and mechanical properties can be optimized in different ways, and at different loadings of differing carbon nano materials. Thus, it is necessary to carefully consider a number of factors when designing methods for incorporating carbon nano materials into polymers.

15 Claims, 7 Drawing Sheets

| Material Information | ppw | | | | | | | | |
|---|---|---|---|---|---|---|---|---|---|
| Description | A1 | B1 | C1 | D1 | E1 | F1 | G1 | H1 | I1 |
| Polyaspartate polyol | 186.160 | 186.160 | 186.160 | 186.160 | 186.160 | 186.160 | 186.160 | 186.160 | 186.160 |
| Aliphatic plasticizer | 5.744 | 5.744 | 5.744 | 5.744 | 5.744 | 5.744 | 5.744 | 5.744 | 5.744 |
| Trimethoxyvinylsilane | 4.726 | 4.726 | 4.726 | 4.726 | 4.726 | 4.726 | 4.726 | 4.726 | 4.726 |
| Silicone air release | 2.812 | 2.812 | 2.812 | 2.812 | 2.812 | 2.812 | 2.812 | 2.812 | 2.812 |
| HC-020051 | 0.199 | 0.300 | 0.499 | 0.997 | 1.994 | 4.986 | 9.972 | 19.944 | 39.888 |
| HC-20435 | | | | | | | | | |
| Part A Subtotal | 199.641 | 199.742 | 199.941 | 200.439 | 201.436 | 204.428 | 209.414 | 219.386 | 239.330 |
| HDI-based isocyanate | 117.840 | 117.883 | 117.968 | 118.183 | 118.612 | 119.900 | 122.045 | 126.337 | 134.919 |
| Part B Subtotal | 117.840 | 117.883 | 117.968 | 118.183 | 118.612 | 119.900 | 122.045 | 126.337 | 134.919 |
| Formula Total | 317.481 | 317.625 | 317.909 | 318.622 | 320.049 | 324.328 | 331.459 | 345.723 | 374.250 |
| % CNT/conductive carbon black | 0.0063 | 0.0094 | 0.0157 | 0.0313 | 0.0623 | 0.1537 | 0.3009 | 0.5769 | 1.0658 |
| ppt CNT/conductive carbon black | 0.063 | 0.094 | 0.157 | 0.313 | 0.623 | 1.537 | 3.009 | 5.769 | 10.658 |
| ppm CNT/conductive carbon black | 62.8 | 94.5 | 156.8 | 313.0 | 623.2 | 1537.3 | 3008.5 | 5768.8 | 10658.2 |
| Part A Theoretical % NV | 97.6 | 97.6 | 97.6 | 97.6 | 97.7 | 97.7 | 97.7 | 97.8 | 98.0 |
| Part A Theoretical Specific Gravity | 1.055 | 1.055 | 1.054 | 1.054 | 1.054 | 1.052 | 1.050 | 1.046 | 1.039 |
| Part A Theoretical WPG | 8.785 | 8.784 | 8.784 | 8.782 | 8.778 | 8.766 | 8.748 | 8.713 | 8.654 |
| Part A Equivalent Weight | 298.987 | 299.029 | 299.108 | 299.310 | 299.710 | 300.896 | 302.816 | 306.460 | 313.053 |
| Part B Theoretical % NV | 100 | 100 | 100 | 100 | 100 | 100 | 100 | 100 | 100 |
| Part B Theoretical Specific Gravity | 1.150 | 1.150 | 1.150 | 1.150 | 1.150 | 1.150 | 1.150 | 1.150 | 1.150 |
| Part B Theoretical WPG | 9.580 | 9.580 | 9.580 | 9.580 | 9.580 | 9.580 | 9.580 | 9.580 | 9.580 |
| Part B Equivalent Weight | 175.000 | 175.000 | 175.000 | 175.000 | 175.000 | 175.000 | 175.000 | 175.000 | 175.000 |
| Stoichiometry Ratio Iso:Polyol | 1.008 | 1.008 | 1.008 | 1.008 | 1.008 | 1.008 | 1.008 | 1.008 | 1.008 |
| Total System Theoretical % NV | 98.511408 | 98.512082 | 98.513411 | 98.516739 | 98.523349 | 98.54283 | 98.57418 | 98.63301 | 98.73721 |
| Total System Theoretical Specific Gravity | 1.088 | 1.088 | 1.088 | 1.088 | 1.087 | 1.086 | 1.085 | 1.082 | 1.076 |
| Total System Theoretical WPG | 9.064 | 9.064 | 9.063 | 9.062 | 9.059 | 9.050 | 9.037 | 9.011 | 8.966 |

FIGURE 1

| Material Information | | ppw | | | | | | | | |
|---|---|---|---|---|---|---|---|---|---|---|
| Description | | Control | A | B | C | D | E | F | G | H |
| Polyaspartate polyol | | 186.160 | 186.160 | 186.160 | 186.160 | 186.160 | 186.160 | 186.160 | 186.160 | 186.160 |
| Aliphatic plasticizer | | 5.744 | 5.744 | 5.744 | 5.744 | 5.744 | 5.744 | 5.744 | 5.744 | 5.744 |
| Trimethoxyvinylsilane | | 4.726 | 4.726 | 4.726 | 4.726 | 4.726 | 4.726 | 4.726 | 4.726 | 4.726 |
| Silicone air release | | 2.812 | 2.812 | 2.812 | 2.812 | 2.812 | 2.812 | 2.812 | 2.812 | 2.812 |
| HC-020051 | | | | | | | | | | |
| HC-20435 | | | 0.598 | 1.197 | 2.393 | 4.787 | 9.573 | 19.146 | 38.293 | 76.586 |
| Part A Subtotal | | 199.442 | 200.040 | 200.639 | 201.835 | 204.229 | 209.015 | 218.588 | 237.735 | 276.028 |
| HDI-based isocyanate | | 117.754 | 117.807 | 117.860 | 117.967 | 118.179 | 118.605 | 119.456 | 121.158 | 124.561 |
| Part B Subtotal | | 117.754 | 117.807 | 117.860 | 117.967 | 118.179 | 118.605 | 119.456 | 121.158 | 124.561 |
| Formula Total | | 317.196 | 317.847 | 318.499 | 319.802 | 322.408 | 327.620 | 338.044 | 358.893 | 400.589 |
| % CNT/conductive carbon black | | 0.0000 | 0.0109 | 0.0218 | 0.0434 | 0.0861 | 0.1695 | 0.3285 | 0.6188 | 1.1089 |
| ppt CNT/conductive carbon black | | 0.000 | 0.109 | 0.218 | 0.434 | 0.861 | 1.695 | 3.285 | 6.188 | 11.089 |
| ppm CNT/conductive carbon black | | 0 | 109.181 | 217.915 | 434.055 | 861.093 | 1694.788 | 3285.1 | 6188.446 | 11088.61 |
| Part A Theoretical % NV | | 97.6 | 97.6 | 97.6 | 97.7 | 97.7 | 97.7 | 97.7 | 98.0 | 98.3 |
| Part A Theoretical Specific Gravity | | 1.055 | 1.055 | 1.055 | 1.055 | 1.054 | 1.054 | 1.053 | 1.052 | 1.050 |
| Part A Theoretical WPG | | 8.788 | 8.785 | 8.785 | 8.784 | 8.783 | 8.780 | 8.774 | 8.765 | 8.750 |
| Part A Equivalent Weight | | 298.906 | 299.667 | 300.428 | 301.947 | 304.978 | 311.006 | 322.934 | 346.287 | 391.078 |
| Part B Theoretical % NV | | 100 | 100 | 100 | 100 | 100 | 100 | 100 | 100 | 100 |
| Part B Theoretical Specific Gravity | | 1.150 | 1.150 | 1.150 | 1.150 | 1.150 | 1.150 | 1.150 | 1.150 | 1.150 |
| Part B Theoretical WPG | | 9.580 | 9.580 | 9.580 | 9.580 | 9.580 | 9.580 | 9.580 | 9.580 | 9.580 |
| Part B Equivalent Weight | | 175.000 | 175.000 | 175.000 | 175.000 | 175.000 | 175.000 | 175.000 | 175.000 | 175.000 |
| Stoichiometry Ratio Iso:Polyol | | 1.008 | 1.008 | 1.008 | 1.008 | 1.008 | 1.008 | 1.008 | 1.008 | 1.008 |
| Total System Theoretical % NV | | 98.510069 | 98.513123 | 98.516164 | 98.52221 | 98.534155 | 98.55748 | 98.60196 | 98.68317 | 98.82024 |
| Total System Theoretical Specific Gravity | | 1.088 | 1.088 | 1.088 | 1.088 | 1.087 | 1.087 | 1.086 | 1.083 | 1.080 |
| Total System Theoretical WPG | | 9.064 | 9.064 | 9.063 | 9.062 | 9.059 | 9.053 | 9.043 | 9.024 | 8.992 |

FIGURE 2

|  |  | ppm Conductive Carbon Black (w/w based on Formula) |  |  |  |  |  |  |  | |
|---|---|---|---|---|---|---|---|---|---|---|
|  |  | 0.0 | 109.2 | 217.9 | 434.1 | 861.1 | 1694.8 | 3285.1 | 6188.4 | 11088.6 | |
| Shear Rate in | 2 | 1.23 | 1.21 | 1.27 | 1.29 | 2.6 | 2.8 | 2.74 | 10.67 | 17.07 | Viscosity |
| Reciprocal | 20 | 1.21 | 1.19 | 1.23 | 1.25 | 1.31 | 1.35 | 1.61 | 1.99 | 2.84 | in Pascal |
| Seconds | 100 | 1.2 | 1.18 | 1.22 | 1.23 | 1.15 | 1.18 | 1.35 | 1.49 | 1.88 | Seconds |
| ($S^{-1}$) | 200 | 1.2 | 1.18 | 1.21 | 1.21 | 1.12 | 1.14 | 1.3 | 1.39 | 1.67 | (PaS) |

FIGURE 4

|  |  | ppm CNT (w/w based on Formula) |  |  |  |  |  |  |  | |
|---|---|---|---|---|---|---|---|---|---|---|
|  |  | 62.8 | 94.5 | 156.8 | 313.0 | 623.2 | 1537.3 | 3008.5 | 5768.8 | 10658.2 | |
| Shear Rate in | 2 | 1.26 | 1.21 | 1.57 | 2.01 | 3.13 | 10.02 | 33.83 | 44.6 | 56.6 | Viscosity |
| Reciprocal | 20 | 1.18 | 1.16 | 1.37 | 1.52 | 1.99 | 3.49 | 8.5 | 7.86 | 8.6 | in Pascal |
| Seconds | 100 | 1.14 | 1.11 | 1.27 | 1.34 | 1.59 | 2.08 | 4.03 | NA | NA | Seconds |
| ($S^{-1}$) | 200 | 1.12 | 1.09 | 1.24 | 1.28 | 1.47 | 1.75 | 3.18 | NA | NA | (PaS) |

FIGURE 5

| Shear Rate | ppm Conductive Carbon Black (w/w based on Formula) | | | | | | | | | |
|---|---|---|---|---|---|---|---|---|---|---|
| Ratio | 0.0 | 109.2 | 217.9 | 434.1 | 861.1 | 1694.8 | 3285.1 | 6188.4 | 11088.6 | |
| $2s^{-1}/20s^{-1}$ | 1.02 | 1.02 | 1.03 | 1.03 | 1.98 | 2.07 | 1.70 | 5.36 | 6.01 | Thixotropy Index |
| $20s^{-1}/200s^{-1}$ | 1.01 | 1.01 | 1.02 | 1.03 | 1.17 | 1.18 | 1.24 | 1.43 | 1.70 | |

FIGURE 6

| Shear Rate | ppm CNT (w/w based on Formula) | | | | | | | | | |
|---|---|---|---|---|---|---|---|---|---|---|
| Ratio | 62.8 | 94.5 | 156.8 | 313.0 | 623.2 | 1537.3 | 3008.5 | 5768.8 | 10658.2 | |
| $2s^{-1}/20s^{-1}$ | 1.07 | 1.04 | 1.15 | 1.32 | 1.57 | 2.87 | 3.98 | 5.67 | 6.58 | Thixotropy Index |
| $20s^{-1}/200s^{-1}$ | 1.05 | 1.06 | 1.10 | 1.19 | 1.35 | 1.99 | 2.67 | | | |

FIGURE 7

|  |  | ppm Conductive Carbon Black (w/w based on Formula) | | | | | | | | | |
| --- | --- | --- | --- | --- | --- | --- | --- | --- | --- | --- | --- |
|  |  | 0.0 | 109.2 | 217.9 | 434.1 | 861.1 | 1694.8 | 3285.1 | 6188.4 | 11088.6 |  |
| Shear Rate in Reciprocal Seconds ($S^{-1}$) | 2 | 1.23 | 1.21 | 1.27 | 1.29 | 2.6 | 2.8 | 2.74 | 10.67 | 17.07 | Viscosity in Pascal Seconds (PaS) |
|  | 20 | 1.21 | 1.19 | 1.23 | 1.25 | 1.31 | 1.35 | 1.61 | 1.99 | 2.84 |  |
|  | 100 | 1.2 | 1.18 | 1.22 | 1.23 | 1.15 | 1.18 | 1.35 | 1.49 | 1.88 |  |
|  | 200 | 1.2 | 1.18 | 1.21 | 1.21 | 1.12 | 1.14 | 1.3 | 1.39 | 1.67 |  |
| Electrical Resistivity ($\Omega$/cm-1) |  | 1.00E+12 | 1.00E+12 | 1.00E+12 | 1.00E+12 | 1.00E+12 | 1.41E+06 | 7.05E+05 | 3.41E+05 | 1.12E+05 |  |

FIGURE 8

|  |  | ppm CNT (w/w based on Formula) | | | | | | | | | |
| --- | --- | --- | --- | --- | --- | --- | --- | --- | --- | --- | --- |
|  |  | 62.8 | 94.5 | 156.8 | 313.0 | 623.2 | 1537.3 | 3008.5 | 5768.8 | 10658.2 |  |
| Shear Rate in Reciprocal Seconds ($S^{-1}$) | 2 | 1.26 | 1.21 | 1.57 | 2.01 | 3.13 | 10.02 | 33.83 | 44.6 | 56.6 | Viscosity in Pascal Seconds (PaS) |
|  | 20 | 1.18 | 1.16 | 1.37 | 1.52 | 1.99 | 3.49 | 8.5 | 7.86 | 8.6 |  |
|  | 100 | 1.14 | 1.11 | 1.27 | 1.34 | 1.59 | 2.08 | 4.03 | NA | NA |  |
|  | 200 | 1.12 | 1.09 | 1.24 | 1.28 | 1.47 | 1.75 | 3.18 | NA | NA |  |
| Electrical Resistivity ($\Omega$/cm-1) |  | 1.00E+12 | 1.00E+12 | 5.08E+08 | 3.02E+06 | 3.29E+05 | 5.68E+04 | 1.42E+04 | 5.19E+03 | 1.46E+03 |  |

FIGURE 9

CARBON NANO MATERIALS IN CROSSLINKED POLYURETHANE AND POLYUREA APPLICATIONS WITH OPTIMIZED PROPERTIES

CROSS REFERENCE TO RELATED APPLICATION

This Application claims priority to U.S. Provisional Patent Application Ser. No. 63/251,149, titled "Carbon Nano Materials in Crosslinked Polyurethane and Polyurea Applications with Optimized Properties," filed on Oct. 1, 2021, which is expressly incorporated by reference herein in its entirety.

FIELD OF INVENTION

The present disclosure generally relates to improving properties of polymer materials. More specifically, the present disclosure relates to the addition of carbon nano materials, such as carbon nanotubes, to polymers to improve the physical properties of the resulting material.

BACKGROUND

One consistent goal in the field of material science is to create or enhance the properties of materials. With regard to polymers, it has long been a goal to create or improve the electrostatic dissipative ("ESD") properties and conductive properties of polymers. Polymers provide a broad range of materials for use in forming composites, coatings, and other useful arrangements of materials. Thus, it has been a long-term goal to design and fabricate polymer composites and coatings with ESD and conductive properties.

Traditionally, conductive carbon black or expensive metal fillers have been used to achieve ESD and conductive properties in composites and coatings. However, these traditional fillers require very high loadings (5-20 wt %) to achieve ESD properties or significant conductive characteristics. Such loading causes a number of problematic issues with composite materials and coatings that affect the ability to process the loaded material and the resulting physical properties of products manufactured from such composite materials and coatings. For example, processability of materials (density, viscosity, kinetics etc. of materials making it more difficult to process), appearance and aesthetic properties (often limiting the color of the products to black or other darker colors), and detrimental impacts on the mechanical and thermal properties of products are common to goods and materials made using these conductive fillers.

Accordingly, there is a need in the field of material science for new arrangements of composites and coatings, and methods for fabricating such arrangements, that provide ESD and conductive properties that eliminate or minimize the problematic issues with current methods of producing such composites and coatings. Such novel methods and arrangements are described herein.

SUMMARY

Carbon nano materials provide a number of benefits to polymer processors seeking to improve the properties of source materials. Examples of polymer materials that may benefit from the incorporation of carbon nano materials include polyurethane and polyurea. Properties or benefits provided by carbon nano materials include creation or enhancement of electrical conductivity and ESD properties, improved thermal conductivity for heat dissipation, optimized tensile and flexural strength and ductility, flame retardancy and/or improved thermal stability, and vibration dampening and sound deadening characteristics. For a polymer processor or material consumer, such improvements often translate into an easier manufacturing process and a better end product, whether it is a thinner product, a stiffer part with reduced weight and cost, or any number of other such benefits.

Unfortunately, current methods of incorporating carbon nano materials into polyurethane and/or polyurea materials are problematic. Such problems with current methods include the necessity of handling dry powders, limited processes for effectively and evenly incorporating the carbon nano materials into a polymer matrix, and safety and environmental considerations. As disclosed herein, novel methods to overcome such problems with current methods have been developed. Such novel methods provide a number of benefits to a polymer processor and end user of any resulting materials or products. As disclosed herein, methods of incorporating carbon nano materials into polymers can achieve benefits with regard to electrical properties, modulus, and thermal stability to name a few of the many benefits. However, enhancing and creating such improvements in material properties must be done with care because creating or enhancing one property does not always result in the creation or improvement in other properties. For example, thermal stability, electrical conductivity, and mechanical properties can be optimized in different ways, and at different loadings of differing carbon nano materials. Thus, it is often necessary to carefully consider a number of factors when designing methods for incorporating carbon nano materials into polymers.

Described herein are the percolation thresholds for several carbon nano materials that achieve specific electrical properties and methods that can be utilized to achieve thermal stability and/or certain thermo-mechanical characteristics.

BRIEF DESCRIPTION OF THE DRAWINGS

In the accompanying drawings, structures are illustrated that, together with the detailed description provided below, describe example embodiments of the disclosed systems, methods, and apparatus. Where appropriate, like elements are identified with the same or similar reference numerals. Elements shown as a single component can be replaced with multiple components. Elements shown as multiple components can be replaced with a single component. The drawings may not be to scale. The proportion of certain elements may be exaggerated for the purpose of illustration.

FIG. 1 is a table depicting formulation of a carbon nanotube and polyurea composite used in experiments described herein.

FIG. 2 is a table depicting formulation of a conductive carbon black and polyurea composite used in experiments described herein.

FIG. 4 is a table depicting viscosity and shear rate as a function of concentration of conductive carbon black in a polyol resin.

FIG. 5 is a table depicting viscosity and shear rate as a function of concentration of carbon nanotube in a polyol resin.

FIG. 6 is a table depicting thixotropy and shear rate as a function of concentration of conductive carbon black in a polyol resin.

FIG. 7 is a table depicting thixotropy and shear rate as a function of concentration of carbon nanotube in a polyol resin.

FIG. 8 is a table depicting resistivity of polyurea composite versus concentration of conductive carbon black, with corresponding viscosity and rheology of polyol-side.

FIG. 9 is a table depicting resistivity of polyurea composite versus concentration of carbon nanotube, with corresponding viscosity and rheology of polyol-side.

DETAILED DESCRIPTION

Figure 3:
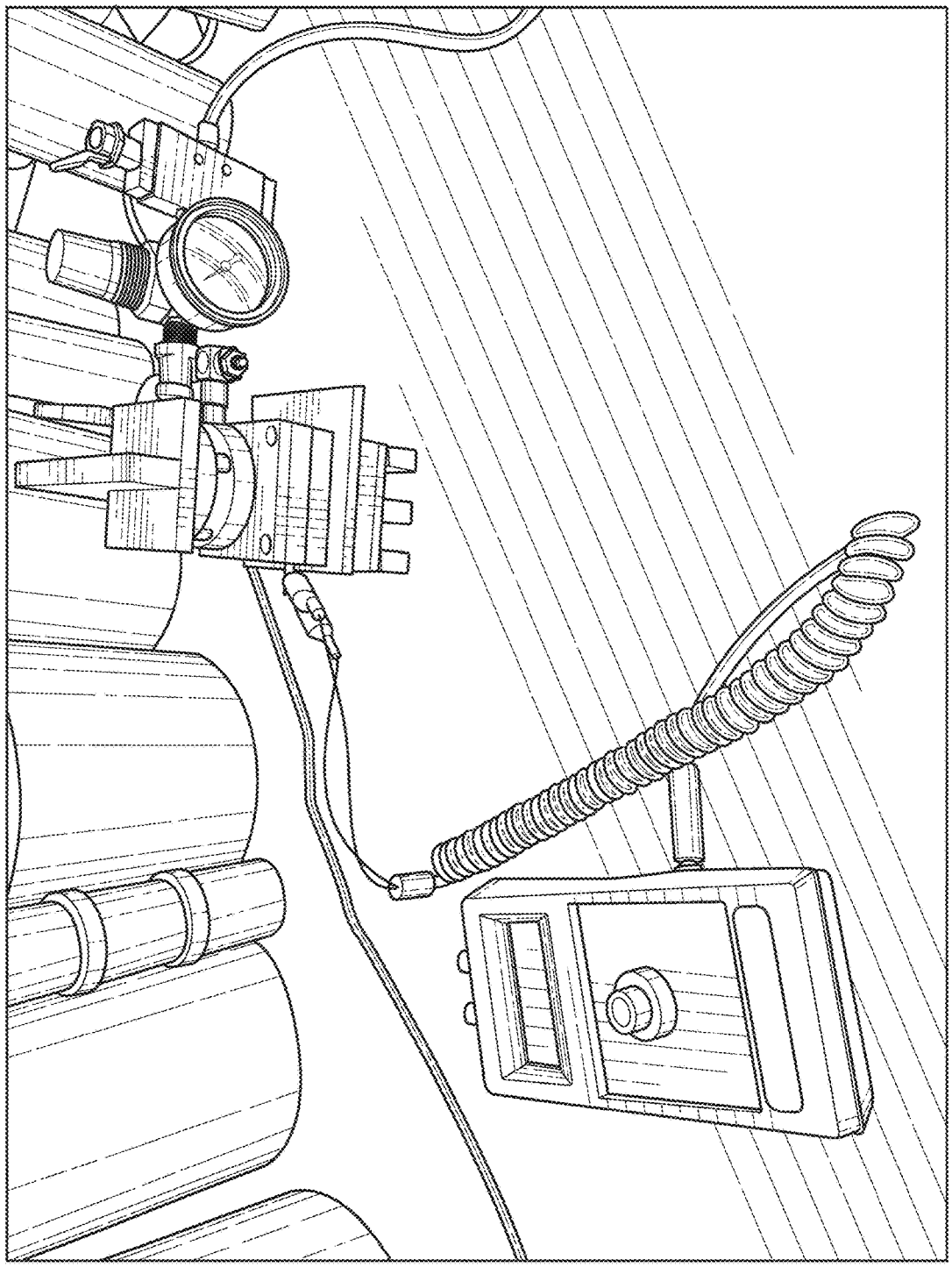
FIG. 3 is a photograph depicting apparatus useful for measuring resistivity between copper plates.

There is considerable potential in the development of electrical benefits of thermally reactive composites and coating using carbon nano materials. There are numerous types of carbon nano materials available, including fullerenes, carbon nanotubes, graphene, and nano diamonds. Carbon nanotubes ("CNT") are cylindrical one-dimensional structures with a very high aspect ratio. Due to their exceptional structural and physical properties, CNTs are a very promising material that can be added to polymers to create or enhance the inherent properties of polymers. The properties of CNTs can be customized (i.e., tuned) to achieve specific results for specific applications. As a function of their physical form and high inherent electrical conductivity, CNTs are especially useful in applications requiring electrical properties. However, with current methods, CNTs are extremely difficult to efficiently disperse and debundle during processing to achieve optimal or even significantly enhanced properties.

There are two current primary approaches to dispersing CNT in a polymer: (i) adding dry CNT powder to the resin mix under agitation via high shear agitation, such as by mixing using a Cowles blade and (ii) preparing a masterbatch or concentrate of 0.01-15% (w/w) CNT which is added to the resin mix under moderate or high shear agitation. In the case of the masterbatch, the dispersion and debundling of CNT occurs during the preparation of the masterbatch or concentrate, and the masterbatch is then diluted to desired concentration in a final application. The goal of such current methods is to achieve a stable, reliable mixture that will provide favorable electrical properties in the final application. However, there are problematic issues posed by either of the current methods described above.

In the case of adding dry to resin, handling and safety issues are of great concern. Since CNT dry powder is very light and fluffy, the powder tends to go airborne in the presence of even a minimal air current or draft. Not only does this result in a loss of potentially valuable material affecting quality and desired concentration, but it also creates an environmental and health safety concern. Too much combustible airborne powder can pose an explosion hazard, and there may be significant health risks to human exposure to carbon-based nanoparticles. For these reasons alone, many material compounders are justifiably concerned with using such methods and prefer to work with masterbatches or concentrates of CNT.

Creating masterbatches poses problematic issues as well. In the preparation of a masterbatch or concentrate, there are two issues with which are of great concerned. The first is the ability to effectively disperse CNT in a polymer matrix. To effectively disperse CNT, a method must break apart and disperse relatively large (micron-scale) agglomerates of CNTs into smaller particles and smaller bundles in the range of hundreds of nanometers average particle diameter. The second issue is the question of exfoliation or debundling of small particles and agglomerates of strands that bundle together due to a variety of forces, especially π-π and van der Waals interactions. CNTs bundles held together by π-π and van der Waals interactions are generally insoluble and not readily dispersible into monomers, polymers, and solvents. This poses a fundamental processing challenge. In order to obtain a gain in electrical, mechanical, or other properties from the use of CNT, it is necessary to achieve a high level of dispersion and debundling. For purposes of this disclosure, dispersion refers to the process of deagglomerating bundles of CNT and dispersing them uniformly into a medium. By contrast, debundling refers to the process of separating bundles of individual strands into smaller bundles and/or individualized strands. The goal is to achieve a uniform distribution of strands through a monomer, solvent, and/or polymeric medium, which leads to the results desired.

Traditional physical and chemical dispersion techniques developed for the processing of CNT composites include the use of ultrasonication or ball milling. However, these methods can cause irreversible damage to the CNT that ultimately harm the desired properties in the resulting composite materials. While mechanical mixing, magnetic stirring and shear intensive stirring can limit damage to CNTs during dispersion, such techniques result in CNTs remaining bundled when using such techniques. This is especially true of a specific class of CNTs called single-wall carbon nanotubes (SWCNT), which have great promise in improving properties of composite materials and coatings.

It is relatively simple to disperse or deagglomerate large (micron scale) bundles of CNT, including SWCNT, by means of a planar milling process such as three-roll (or two-roll) milling. Use of a planar milling process reduces the chance or opportunity for damage to the primary CNT particle, while allowing for efficient deagglomeration. A much more difficult task is to overcome π-π and van der Waals interactions by any form of milling or dispersion. A common problem for material compounders is that when CNT (masterbatch or dry power mixing) is introduced into a coatings or composite formulation at sufficiently high loading as to achieve desired electrical conductivity, the viscosity of the compound increases to the point that it is difficult if not impossible to mix or process the resulting mixture. There have been cases where compounders inadvertently burned out motors of mixers attempting to mix such high-viscosity materials. This is due to high viscosity resulting from the surface area of CNT being extremely high, which exponentially increases as small agglomerates are dispersed and debundled.

As disclosed herein, we have evaluated and compared rheological and conductive properties of traditional conductive carbon black and single walled carbon nanotubes in a crosslinked aliphatic polyurea system in order to develop and demonstrate novel methods for incorporating such single walled carbon nanotubes into polymer systems.

In a first method, a CNT masterbatch dispersion is formed of SWCNT (10 wt %) in a plasticizer using high shear mixing techniques. A range of 0.1 to 15% (weight/weight, or w/w/) is possible, but in this example, 10% (w/w) was used. The masterbatch SWCNT dispersion is further diluted in compounding and the sample preparation process.

Numerous formulations were prepared with targeted concentrations of CNT from roughly 60 to 11000 parts per million ("ppm"), based upon total formulation. To prepare these formulations, a stable masterbatch SWCNT dispersion was diluted and blended with polyol resin in varying proportion and cured using aromatic isocyanate at 1:1 equivalent stoichiometry. All samples were cured at 65° C. FIG. 1 shows a table of formulary of the quantities and properties of the materials used to evaluate CNT dispersions in polyol resin in this disclosure.

For purposes of comparing such CNT dispersion in polyol resin to traditional conductive carbon black blended with a polymer, a masterbatch of 5.8% conductive carbon black was prepared in polypropylene-oxide-based polyol and diluted with polyol to achieve concentrations between 0 and 11000 ppm based upon total formulation. Again, stoichiometry of 1:1 equivalence was employed, and the samples were cured at 65° C. FIG. 2 shows a table of formulary of quantities and properties achieved for comparison materials.

For the formulations described above, after the CNT or conductive black was diluted and mixed into the polyol, and prior to addition of isocyanate, samples were tested for viscosity and rheological characteristics using a TA Instruments Discovery HR-10 Rheometer. Two primary methods of investigation were used. First, at very low concentrations of CNT or conductive carbon black, controlled strain measurements were taken of Part A (as shown in tables of FIGS. 1 and 2), at two, twenty, one-hundred, and two-hundred reciprocal seconds ($2\ s^{-1}$ $20\ s^{-1}$, $100\ s^{-1}$, and $200\ s^{-1}$). Each datapoint reported is the average of ten (10) datapoints collected at six (6) second intervals for each reading, using a 50 mm 2° cone and plate geometry, at 25° C. Secondly, at loadings above 5000 ppm of CNT and conductive carbon black, it was observed that this method did not produce consistent contact between the 50 mm cone and the sample at higher shear rates. Consequently, it was determined to verify the results using controlled frequency sweeps, from 0.001 to 100 radians per second, at 5% strain, using 25 mm plate and plate geometry. From this method, and the complex viscosity/shear rate data obtained it was possible to correlate and verify viscosity measurements as taken at specific shear rates. All measurements were collected at 25° C.

In order to measure electrical resistivity, the following procedure was used: (i) the formulations described above were poured into 50 mm aluminum petri dishes, to roughly three millimeters (3 mm) thickness, and cured in an oven at 65° C. for twenty (20) minutes; (ii) 40-mill drawdowns were performed on Leneta charts, and evaluated visually for color, appearance, and presence of agglomerates, where the drawdowns were also cured in an oven at 65° C. for twenty (20) minutes; (iii) following cure, samples were removed from the aluminum petri dishes, and sharp edges were removed; (iv) once the samples were thus prepared, thickness and diameter measurements were taken using digital calipers to ensure that variation in sample dimensions did not contribute to variation in electrical conductivity measurements; (v) the samples were sandwiched between two 75 mm square copper plates, to assure uniform contact, the plates were coated with an electrically conductive adhesive (an image of this conductivity apparatus is shown in FIG. 3); and electrodes were connected to the coper plates, approximately four centimeters apart, and resistivity measurements were taken.

Two instruments were used during this process: a Ransburg Model 76634-00; and a Sperry model DM-350A. All results described below are based on a statistical average of at least three readings in which there was strong inter-instrument agreement.

In general, it was observed that with increasing concentration of conductive filler, there is an increase in viscosity and thixotropy of the formulation polyol-side. It was also found that increasing concentration of CNT increases the viscosity of the polyol-side more rapidly than conductive carbon black. A table of viscosities, shear rates, and concentration of CNT (ppm, weight/weight based on total formulation) is shown in FIG. 4, and a table of viscosities, shear rates, and concentration of conductive carbon black is shown in FIG. 5.

In the tables of FIGS. 4 and 5, it is noted that viscosity increases (with increasing concentration) are dramatic at the lowest shear rates. This suggests that as surface area of conductive filler increases, the resin matrix has increasing difficulty in wetting the surfaces of the available filler, with the result that it takes increasing amounts of energy to disturb the matrix and produce flow. CNT has greater surface area and induces greater structure than conductive carbon black in a resinous structure. However, what is interesting is that CNT did not produce significantly greater thixotropy at a given concentration than conductive carbon black. FIGS. 6 and 7 show computations of thixotropic indexes for both conductive carbon black and CNT by dividing viscosity at $2\ s^{-1}$ by viscosity at $20\ s^{-1}$, and viscosity at $20\ s^{-1}$ by viscosity at $200\ s^{-1}$. As can be seen in the tables of FIGS. 6 and 7, CNT does not induce significantly greater thixotropy than conductive carbon black; however, the structure is higher.

With regard to resistivity findings, these are best explained in the context of viscosity and rheology. FIGS. 8 and 9 are tables that demonstrate how resistivity changes with increasing concentration of conductive filler, and with changing rheology.

As illustrated by the tabulated data of FIGS. 8 and 9, conductive carbon black did not reach a percolation threshold for electrostatic resistivity (ESD) until a concentration of 1600 ppm (w/w). The data shows that such percolation is not likely to have occurred below 1000 ppm, or 0.1% by weight. By contrast, using CNT, the percolation threshold for ESD resistivity was achieved at roughly 150 ppm, or approximately than one tenth the loading of nanoparticles required if using conductive carbon black.

Figure 10:
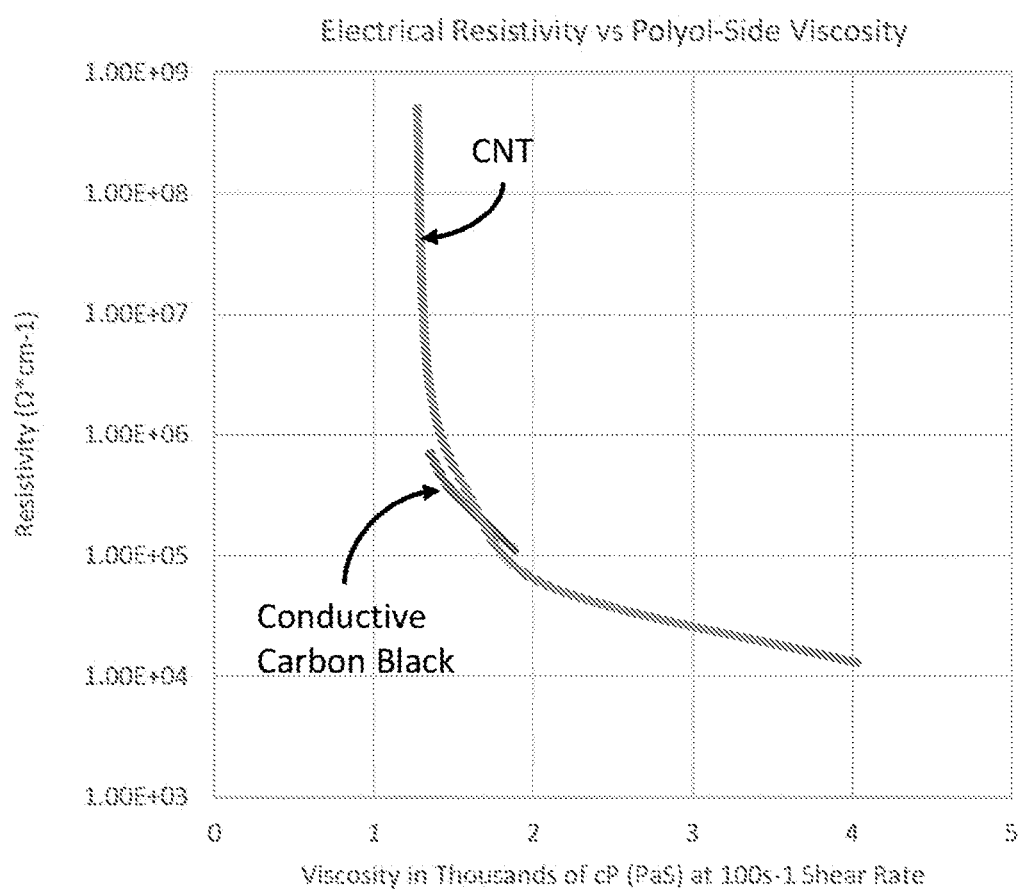
FIG. 10 depicts a graph of viscosity of polyol-side at shear rate $100^{s-1}$ vs. electrical resistivity of polyurea composite in ohms per centimeter ($\Omega*cm^{-1}$) for both conductive carbon black and carbon nanotube as conductive filler.

The data discloses the relationship between concentration of nanoparticles and resultant viscometric and electrical properties of the formulation. It is also important to consider the relationship between the viscosity of a polyol-side and resulting degree of ESD resistivity or electrical conductivity. Accordingly, FIG. 10 is a graph demonstrating impact of CNT and conductive carbon black upon the viscosity of our polyol-side when formulating for specific levels of electrical resistivity. Specifically, the graph depicts viscosity of polyol-side at shear rate $100^{\ s-1}$ vs. electrical resistivity of polyurea composite in ohms per centimeter ($\Omega *cm^{-1}$).

In this disclosure, the influence of two types of conductive nanoparticles upon the rheology and electrical resistivity of a polyurea system were compared over a range of loadings from 0.006% (60 ppm) to 1.100% based upon weight of the total formulation. For purposes of consistency and comparison, it was attempted to keep the concentrations of CNT and amorphous conductive carbon black at significantly similar levels. However, the properties of CNT and conductive carbon black do not readily lend themselves to a simple comparison in this manner. For example, using CNT, it was possible to achieve a percolation threshold for ESD resistivity at about 150 ppm. However, in this system, using conductive carbon black, ESD resistivity was not detected in our testing until the significantly higher 1600 ppm.

As can be seen in FIG. 10, the influence of CNT upon viscosity of the polyol-side of the formulation can be minimal. Viscosity of polyol increased from roughly 1200 to 1400 cP at 20 s$^{-1}$ through the introduction of 1500 ppm of the CNT masterbatch, representing about 150 ppm of CNT introduced to the system. At about 600 ppm of CNT in the formulation, there does occur an inflection point above which the influence of CNT upon the viscosity of the polyol is more significant.

With respect to the conductive carbon black, as noted previously, ESD resistivity was not attained until nearly 1700 ppm, but the viscosity at 20 s$^{-1}$ of 1350 cP was similar to that of the polyol using 150 ppm of CNT. In this range, the viscosity of the polyol does not increase quickly using elevated levels of carbon black—but the resistivity also does not decrease rapidly with increasing concentration. A review of FIG. 10 shows that resistivity decreases much more quickly using CNT than conductive carbon black and that the rate of decreasing resistivity outpaces the rate of increasing viscosity.

This disclosure demonstrates a method of using a CNT masterbatch to produce polyurea materials with ESD conductivity using a total of 100-300 ppm CNT. Since CNT and conductive carbon black are relatively expensive, the ability to achieve properties at low loadings has important implications with respect to cost. From a process perspective, this disclosure demonstrates a process for achieving electrical resistivity of $10^4$ Ω*cm$^{-1}$ with polyol viscosities below 4000 cP at a shear rate of 100 s$^{-1}$, 25° C. These findings further suggest the likelihood of being able to achieve full conductivity in polyurethane and polyurea composites that are processible using a variety of equipment and/or process parameters.

The foregoing description of examples has been presented for purposes of illustration and description. It is not intended to be exhaustive or limiting to the forms described. Numerous modifications are possible in light of the above teachings. Some of those modifications have been discussed, and others will be understood by those skilled in the art. The examples were chosen and described in order to best illustrate principles of various examples as are suited to particular uses contemplated. The scope is, of course, not limited to the examples set forth herein, but can be employed in any number of applications and equivalent devices by those of ordinary skill in the art.

We claim:

1. A method of making a crosslinked aliphatic polyurea polymer with rheological and conducting properties, the method comprising:
   providing a carbon nanotube masterbatch dispersion comprising from 0.1% to 15% (weight/weight) of carbon nanotubes;
   blending an amount of the carbon nanotube masterbatch and a polyol resin to obtain a carbon nanotube polyol resin blend, to afford a concentration of carbon nanotubes in the polyol resin of from 60 ppm to 11000 ppm, and the polyol viscosity is below 4000 cP at a shear rate of 100 s$^{-1}$, 25° C.;
   mixing the carbon nanotube polyol blend and polyisocyanate in a 1:1 polyol: polyisocyanate stoichiometry to form a polymer mixture; and
   curing the polymer mixture in a form;
   wherein the resulting polymer has electrical resistivity of $10^4$ Ω*cm$^{-1}$ or more.

2. The method of claim 1, wherein the concentration of the carbon nanotube in the polyol resin does not exceed 600 ppm.

3. The method of claim 1, wherein the concentration of the carbon nanotubes in the polyol resin is 150 ppm.

4. The method of claim 3, wherein the polyol viscosity is about 1400 cP at 20 s$^{-1}$.

5. The method of claim 1, wherein the carbon nanotubes are single wall carbon nanotubes.

6. A crosslinked aliphatic polyurea polymer comprising:
   a carbon nanotube polyol resin blend, wherein the concentration of carbon nanotubes in the polyol resin blend is from 60 ppm to 11000 ppm, and the polyol viscosity is below 4000 cP at a shear rate of 100 s$^{-1}$, 25° C.; and
   blending polyisocyanate in a 1:1 stoichiometry with the polyol resin
   wherein upon curing the polyol carbon nanotube and polyisocyanate mixture to form a polymer, wherein the polymer has electrical resistivity of $10^4$ Ω*cm$^{-1}$ or more.

7. The crosslinked aliphatic polyurea polymer of claim 6, wherein the concentration of carbon nanotubes in the polyol resin does not exceed 600 ppm.

8. The crosslinked aliphatic polyurea polymer of claim 6, wherein the concentration of carbon nanotubes in the polyol resin is 150 ppm.

9. The crosslinked aliphatic polyurea polymer of claim 6, wherein the polyol resin viscosity is about 1400 cP at 20 s$^{-1}$.

10. The crosslinked aliphatic polyurea polymer of claim 6, wherein the carbon nanotubes are single wall carbon nanotubes.

11. A carbon nanotube polyol blend obtained by a method comprising:
    providing a carbon nanotube masterbatch dispersion comprising from 0.1% to 15% (weight/weight) of carbon nanotubes;
    blending an amount of the masterbatch and a polyol resin to obtain a carbon nanotube polyol resin blend, wherein the concentration of carbon nanotubes in the polyol resin blend is from 60 ppm to 11000 ppm, and the polyol viscosity is below 4000 cP at a shear rate of 100 s$^{-1}$, 25° C.; and
    the carbon nanotubes in the polyol resin blend are characterized by an electrical resistivity of $10^4$ Ω*cm$^{-1}$ or more when the polyol resin in the carbon nanotube in the polyol resin blend is combined in a 1:1 stoichiometric ratio with a polyisocyanate and cured.

12. The carbon nanotube polyol blend of claim 11, wherein the concentration of carbon nanotubes in the polyol resin does not exceed 600 ppm.

13. The carbon nanotube polyol blend of claim 11, wherein the concentration of the carbon nanotube in the polyol resin is 150 ppm.

14. The carbon nanotube polyol blend of claim 11, wherein the polyol resin viscosity is about 1400 cP at 20 s$^{-1}$.

15. The carbon nanotube polyol blend of claim 11, wherein the carbon nanotubes are single wall carbon nanotubes.

* * * * *